(12) United States Patent
Ding

(10) Patent No.: US 11,582,369 B2
(45) Date of Patent: Feb. 14, 2023

(54) CAMERA MODULE WITH IMPROVED HEAT DISSIPATION FUNCTION AND ELECTRONIC DEVICE

(71) Applicant: TRIPLE WIN TECHNOLOGY(SHENZHEN) CO.LTD., Shenzhen (CN)

(72) Inventor: Dan-Dan Ding, Shenzhen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 0 days.

(21) Appl. No.: 17/353,752

(22) Filed: Jun. 21, 2021

(65) Prior Publication Data
US 2021/0397072 A1 Dec. 23, 2021

(30) Foreign Application Priority Data
Jun. 22, 2020 (CN) .......................... 202010576012.4

(51) Int. Cl.
*H04N 5/225* (2006.01)
*G03B 17/55* (2021.01)
(Continued)

(52) U.S. Cl.
CPC ......... *H04N 5/22521* (2018.08); *G02B 7/006* (2013.01); *G03B 11/00* (2013.01);
(Continued)

(58) Field of Classification Search
CPC ............... H04N 5/2251; H04N 5/2252; H04N 5/22521; H04N 5/2253; H04N 5/2254;
(Continued)

(56) References Cited

U.S. PATENT DOCUMENTS

2009/0014822 A1* 1/2009 Poo .................... H01L 27/14683
257/E31.127
2011/0116162 A1* 5/2011 Tsujimura .......... H04N 5/22521
359/359
(Continued)

FOREIGN PATENT DOCUMENTS

| CN | 105578736 | * | 5/2016 | .......... H05K 1/0204 |
| TW | 200930057 A | | 7/2009 | |
| TW | M460298 U1 | | 8/2013 | |

OTHER PUBLICATIONS

Wikipedia, Thermal Interface Material (TIM), Published Jun. 3, 2020, p. 1 (Year: 2020).*

*Primary Examiner* — Twyler L Haskins
*Assistant Examiner* — Akshay Trehan
(74) *Attorney, Agent, or Firm* — ScienBiziP, P.C.

(57) ABSTRACT

The camera module with improved heat dissipation function include a base, a photosensitive chip, a circuit board; and a heat conducting sheet. Wherein the base comprises a first surface and a second surface opposite to the first surface. A portion of the first surface is recessed to form a third surface between the first surface and the second surface, and to form a plurality of sidewalls connecting the first surface and the third surface, the third surface and the plurality of sidewalls cooperatively define a slot. Wherein the photosensitive chip is fixed on the third surface and accommodated in the slot; the circuit board is fixed on the first surface. A gap is defined between the circuit board and the photosensitive chip; the heat conducting sheet is disposed in the gap.

16 Claims, 5 Drawing Sheets

(51) Int. Cl.
  *G03B 30/00* (2021.01)
  *G03B 11/00* (2021.01)
  *H05K 1/02* (2006.01)
  *H05K 7/20* (2006.01)
  *H04M 1/02* (2006.01)
  *G02B 7/00* (2021.01)

(52) U.S. Cl.
  CPC ............ *G03B 17/55* (2013.01); *G03B 30/00* (2021.01); *H04N 5/2251* (2013.01); *H04N 5/2253* (2013.01); *H04N 5/2254* (2013.01); *H04N 5/2257* (2013.01); *H05K 1/0203* (2013.01); *H05K 7/2039* (2013.01); *H04M 1/0264* (2013.01)

(58) Field of Classification Search
  CPC ...... H04N 5/2257; G03B 11/00; G03B 17/02; G03B 17/55; G03B 30/00; G03B 2217/002; H04M 1/0264; H05K 1/0201–021; H05K 7/04; H05K 7/2039–20518; G02B 7/006
  See application file for complete search history.

(56) References Cited

U.S. PATENT DOCUMENTS

| | | | |
|---|---|---|---|
| 2014/0307162 A1* | 10/2014 | Li | H04N 5/2257 348/373 |
| 2015/0028187 A1* | 1/2015 | Jin | H01L 27/14625 250/208.1 |
| 2017/0280558 A1* | 9/2017 | Ohara | G03B 17/55 |
| 2018/0241917 A1* | 8/2018 | Zhang | G03B 17/55 |
| 2019/0373142 A1* | 12/2019 | Fujiwara | H04N 5/2252 |
| 2021/0195076 A1* | 6/2021 | Chen | H04N 5/2256 |

* cited by examiner

CAMERA MODULE WITH IMPROVED HEAT DISSIPATION FUNCTION AND ELECTRONIC DEVICE

FIELD

The subject matter herein generally relates to cameras, especially to a camera module and an electronic device.

BACKGROUND

The camera module comprises a lens assembly, a base, a filter, a photosensitive chip, and a circuit board. The base is arranged on the circuit board, and the photosensitive chip is also arranged on the circuit board and accommodated in the base. The lens assembly and the filter are arranged on a side of the base away from the photosensitive chip. Heat may be generated during the working process of the photosensitive chip, and the air in the base may not circulate quick enough to dissipate the heat, thus causing the photosensitive chip to malfunction.

BRIEF DESCRIPTION OF THE DRAWINGS

Implementations of the present technology will now be described, by way of example only, with reference to the attached figures.

DETAILED DESCRIPTION

Figure 1:
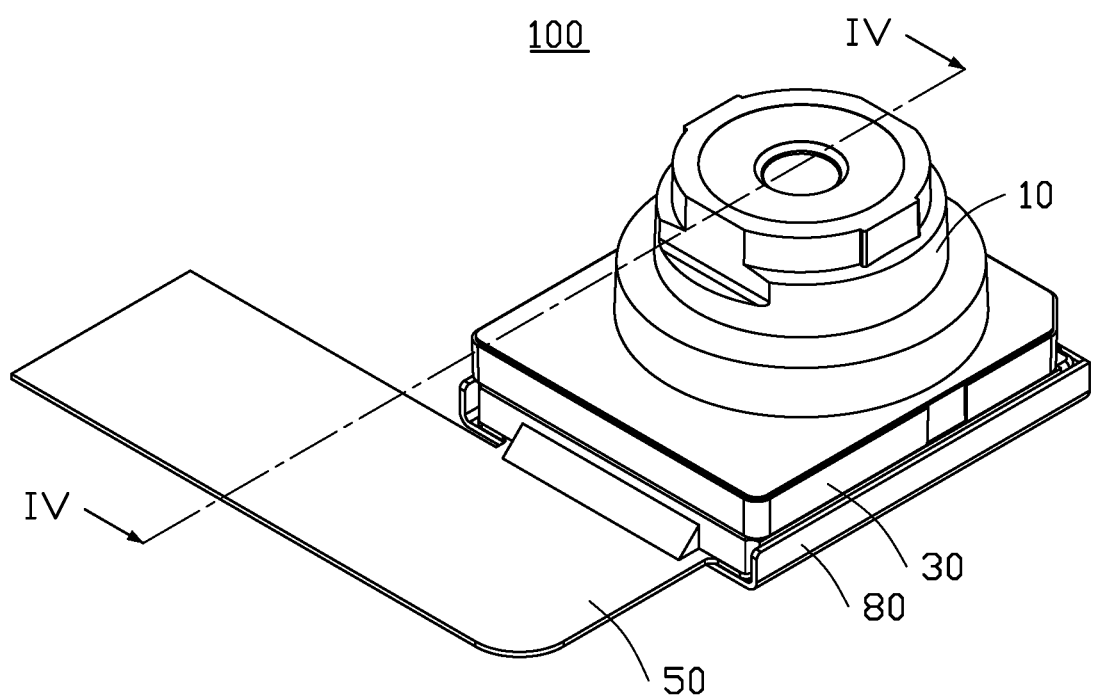
FIG. 1 is a diagrammatic view of a camera module according to an embodiment of the present disclosure.
Figure 2:
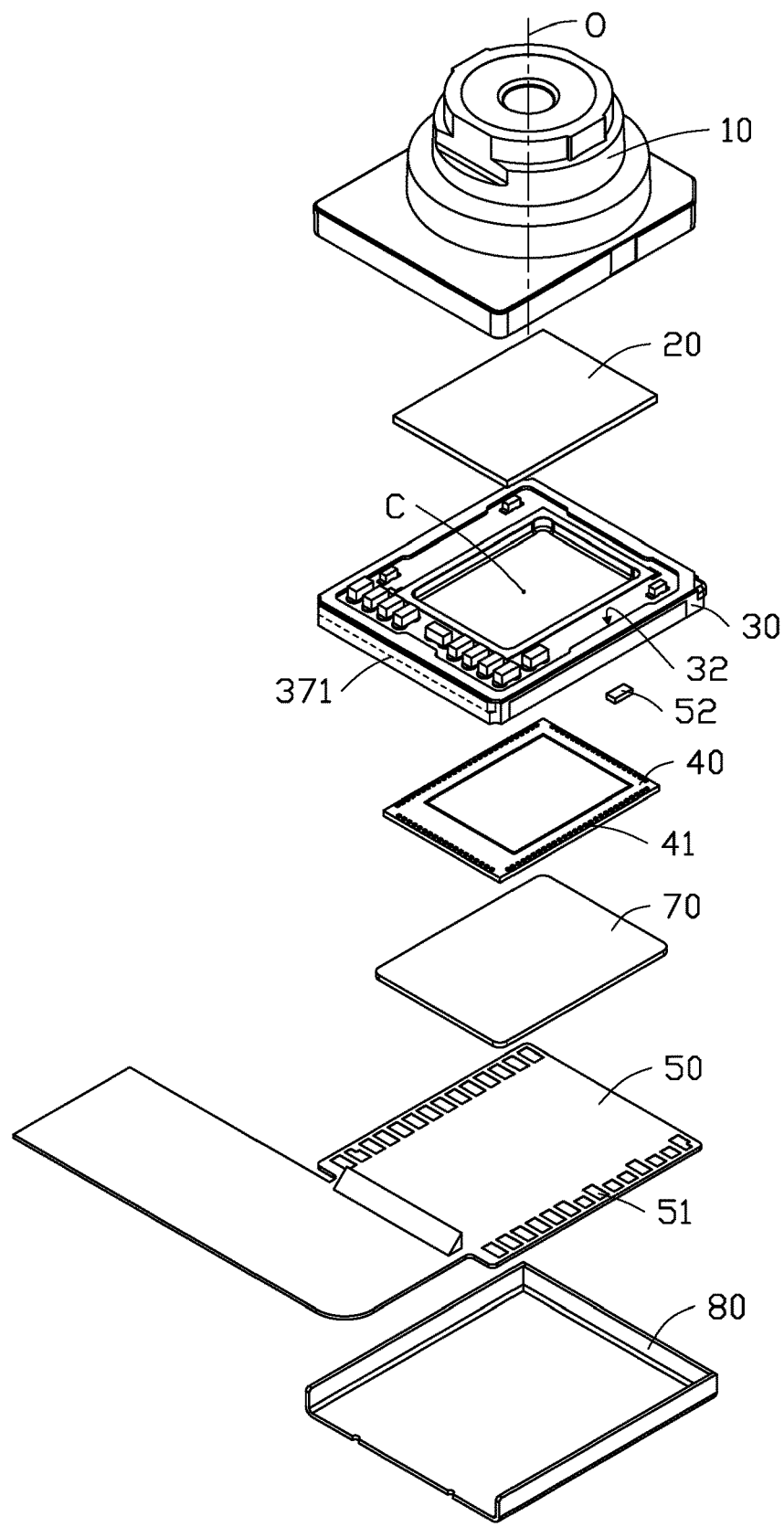
FIG. 2 is an exploded view of the camera module of FIG. 1.
Figure 3:
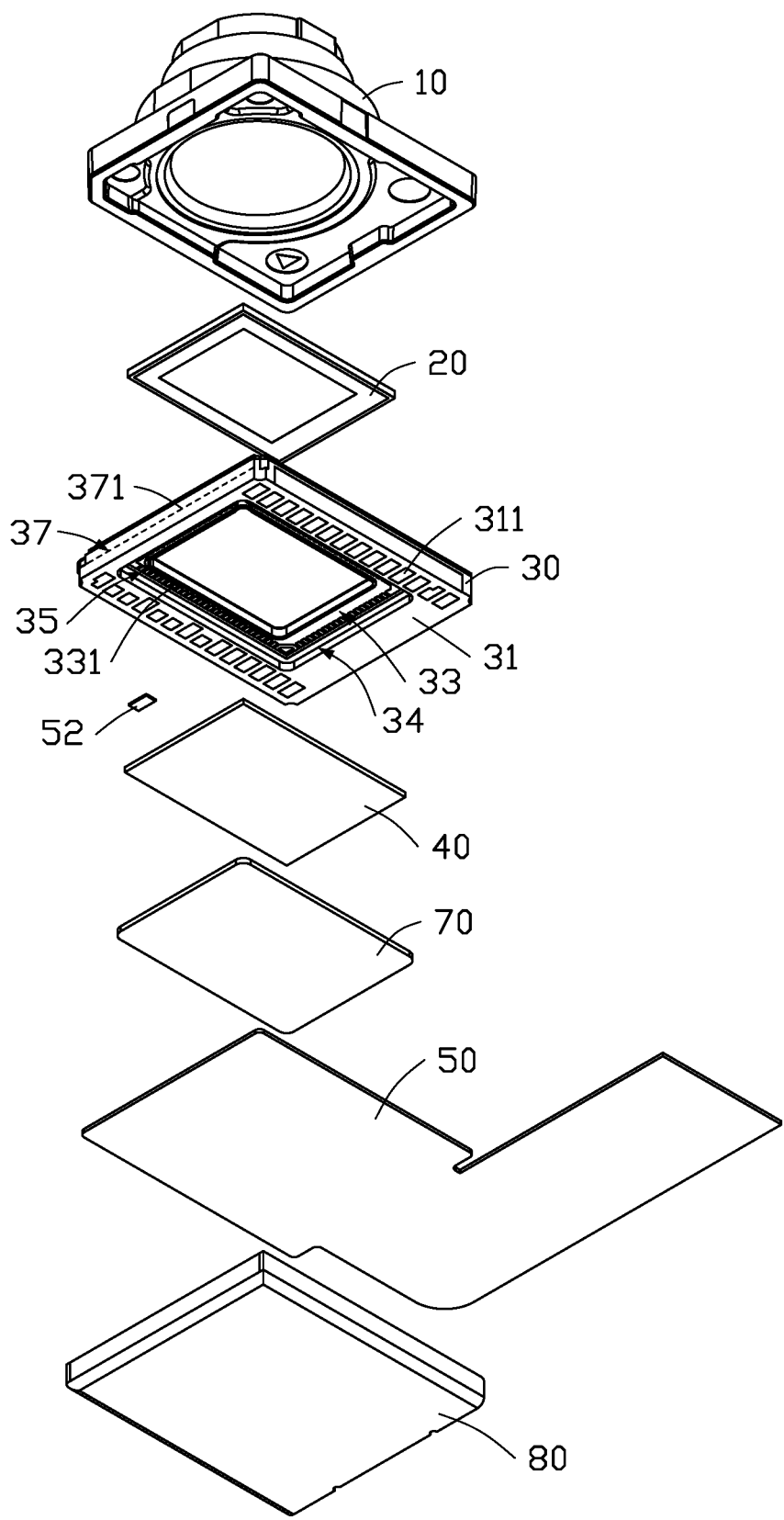
FIG. 3 is an exploded view of the camera module of FIG. 1, from another angle.
Figure 4:
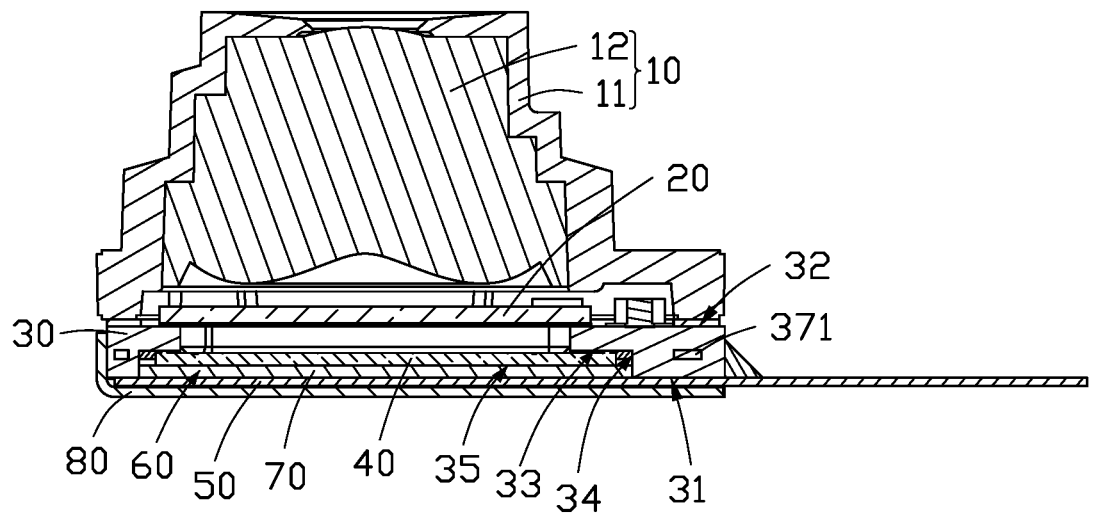
FIG. 4 is a cross-sectional view of the camera module of FIG. 1 along line IV-IV.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIGS. 1-4, an embodiment of the present disclosure provides a camera module 100. The camera module 100 includes a base 30, a photosensitive chip 40, and a circuit board 50. The base 30 comprising a first surface 31 and a second surface 32 opposite to the first surface 31. The first surface 31 is partially recessed inwards to form a third surface 33 between the first surface 31 and the second surface 32, and a plurality of sidewalls 34 connecting the first surface 31 and the third surface 33. The third surface 33 and the plurality of sidewalls 34 cooperatively define a slot 35.

The photosensitive chip 40 is fixed on the third surface 33 and accommodated in the slot 35. The circuit board 50 is arranged on the first surface 31, and a gap 60 between is defined between the circuit board 50 and the photosensitive chip 40. A heat conducting sheet 70 is arranged in the gap 60, which can transmit the heat generated by the photosensitive chip 40 to the circuit board 50. By setting the heat conducting sheet 70 between the circuit board 50 and the photosensitive chip 40, the heat generated by the photosensitive chip 40 can be quickly transmitted to the circuit board 50, thereby reducing a risk of failure of the camera module 100 caused by poor heat dissipation of the photosensitive chip 40.

In the embodiment, a plurality of first conductive pads 311 is disposed on the first surface 31. A plurality of second conductive pads 51 corresponding to the first conductive pads 311 is disposed on the circuit board 50. A conductive adhesive 52 is disposed between the first conductive pads 311 and the second conductive pads 51. The conductive adhesive 52 can electrically connect the first conductive pads 311 to the second conductive pads 51, so as to realize an electrical connection between the circuit board 50 and the base 30.

In the embodiment, a plurality of third conductive pads 331 are arranged on the third surface 33. A plurality of solder balls 41 corresponding to the third conductive pads 331 are disposed on an edge of the photosensitive chip 40. The solder balls 41 are electrically connected to the third conductive pad 331 by welding, so as to realize an electrical connection between the photosensitive chip 40 and the base 30.

In the embodiment, the base 30 also includes a conductive line 37. The conductive line 37 includes the first conductive pads 311 and the third conductive pads 331, and also includes a line body 371 embedded in the base 30.

In the embodiment, the thermal conductive sheet 70 is made of thermal conductive silica gel, which has certain adhesiveness. Thus, the thermal conductive silica gel and the conductive adhesive 52 cooperate together to realize the stable electrical connection between the base 30 and the circuit board 50.

In the embodiment, the circuit board 50 is a flexible circuit board. In other embodiments, the circuit board 50 is a rigid circuit board or a flexible-rigid circuit board.

In the embodiment, the camera module 100 also includes a heat dissipation plate 80, which is arranged on a side of the circuit board 50 away from the photosensitive chip 40. The heat generated by the photosensitive chip 40 is transmitted to the circuit board 50 through the heat conducting sheet 70, and the circuit board 50 transfers the heat to the heat dissipation plate 80. The heat dissipation plate 80 dissipates the heat to an ambient environment of the camera module 100.

In the embodiment, the heat dissipation plate 80 is a steel plate, which can further strengthen an overall strength of the camera module 100.

In the embodiment, the camera module 100 also includes a lens assembly 10 and a filter 20. The lens assembly 10 is arranged on the filter 20. The filter 20 is arranged on the second surface 32. The base 30 includes a light through hole 36 penetrating through the first surface 31 and the third surface 33. The filter 20 covers the light through hole 36, and a center axis C of the light through hole 36 is located on an extension line of the light through axis O of the lens assembly 10.

In the embodiment, the lens assembly 10 includes a lens base 11 and an optical lens group 12 disposed in the lens base 11. The optical lens group 12 transmits light from the ambient environment towards the photosensitive chip 40. The photosensitive chip 40 converts the light into an electrical signal.

The embodiment also provides an assembly method of the camera module 100, including following steps.

S1: the lens assembly 10, the filter 20, the base 30, the photosensitive chip 40, and the circuit board 50 are provided. The base 30 comprising a first surface 31 and a second surface 32 opposite to the first surface 31. The first surface 31 is partially recessed inwards to form a third surface 33 between the first surface 31 and the second surface 32, and a plurality of sidewalls 34 connecting the first surface 31 and the third surface 33. The third surface 33 and the plurality of sidewalls 34 cooperatively define a slot 35.

S2: the filter 20 is set on the second surface 32, the lens assembly 10 is set on the second surface 32, and the filter 20 is placed in the lens base 11 of the lens assembly 10.

S3: the sensitive chip 40 is set in the slot 35 and connected to the third surface 33.

S4: the heat conducting sheet 70 is arranged in the slot 35, causing one side of the heat conduction plate 70 to contact the photosensitive chip 40.

S5: the circuit board 50 is fixed to the first surface 31, causing the other side of the heat conduction sheet 70 to contact the circuit board 50 to obtain the camera module 100.

In other embodiments, the order from step S4 to step S5 can also be exchanged.

In the embodiment, in step S4, the heat conduction sheet 70 can be set in the slot 35 by a patch machine. In other embodiments, the heat conduction sheet 70 can be manually arranged in the slot 35.

Figure 5:
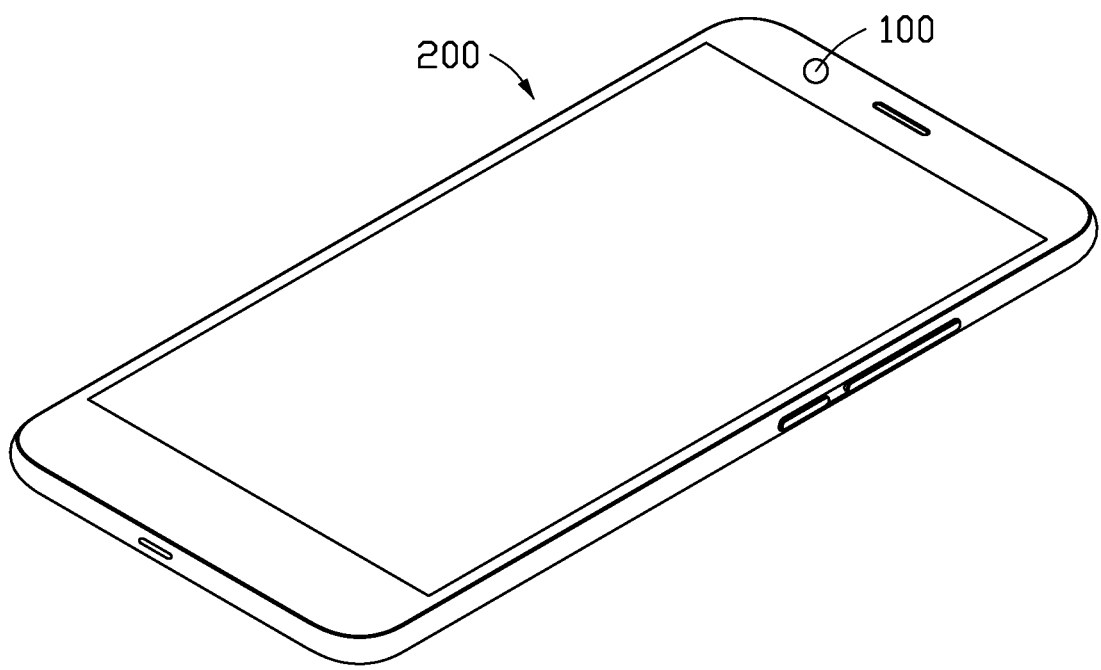
FIG. 5 is a diagrammatic view of an electronic device according to an embodiment of the present disclosure.

Referring to FIG. 5, the embodiment also provides an electronic device 200, which includes the camera module 100. The electronic device can be any electronic device with image capturing function, such as mobile phone, computer, tablet computer, watch, etc.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A camera module, comprising:
    a base comprising a slot;
    a photosensitive chip;
    a circuit board;
    a heat conducting sheet; and
    a heat dissipation plate;
    wherein the base comprises a first surface and a second surface opposite to the first surface, a portion of the first surface is recessed to form a third surface between the first surface and the second surface, and to form a plurality of sidewalls connecting the first surface and the third surface, the third surface and the plurality of sidewalls cooperatively define the slot;
    wherein the photosensitive chip is fixed on the third surface and accommodated in the slot; the circuit board is fixed on the first surface, a gap is defined between the circuit board and the photosensitive chip; the heat conducting sheet is disposed in the gap, one side of the heat conducting sheet contacts the photosensitive chip, the other side of the heat conducting sheet contacts the circuit board, the heat dissipation plate disposed on a side of the circuit board away from the photosensitive chip, thereby causing heat generated by the photosensitive chip to conduct successively to heat conducting sheet, the circuit board, and the heat dissipation plate.

2. The camera module according to claim 1, wherein a plurality of first conductive pads is disposed on the first surface, a plurality of second conductive pads is disposed on the circuit board, a conductive adhesive is disposed between the plurality of first conductive pads and the plurality of second conductive pads, and the circuit board and the base are electrically connected to each other through the plurality of second conductive pads and the plurality of first conductive pads.

3. The camera module according to claim 2, wherein a plurality of third conductive pads is disposed on the third surface, the photosensitive chip comprises a plurality of solder balls corresponding to the plurality of third conductive pads, and the plurality of solder balls is electrically connected to the plurality of third conductive pads, so that the photosensitive chip is electrically connected to the base.

4. The camera module according to claim 3, wherein the base further comprises a conductive line, the conductive line comprises the plurality of first conductive pads and the plurality of third conductive pads, and further comprises a line body embedded in the base.

5. The camera module according to claim 1, wherein the heat dissipation plate is a steel plate.

6. The camera module according to claim 1, further comprising a lens assembly and a filter, wherein the lens assembly is arranged on the filter, the filter is arranged on the second surface; the base further comprises a light through hole penetrating through the first surface and the third surface, the filter covers the light through hole, and a center axis of the light through hole is located on an extension line of a light through axis of the lens assembly.

7. The camera module according to claim 1, wherein the heat conducting sheet is made of a heat conducting silica gel.

8. The camera module according to claim 1, wherein the circuit board is a flexible circuit board.

9. An electronic device, comprising:
    a camera module comprising:
        a base comprising a slot;
        a photosensitive chip;
        a circuit board;
        a heat conducting sheet; and
        a heat dissipation plate;
    wherein the base comprises a first surface and a second surface opposite to the first surface, a portion of the first surface is recessed to form a third surface between the first surface and the second surface, and to form a plurality of sidewalls connecting the first surface and the third surface, the third surface and the plurality of sidewalls cooperatively define the slot;
    wherein the photosensitive chip is fixed on the third surface and accommodated in the slot; the circuit board is fixed on the first surface, a gap is defined between the circuit board and the photosensitive chip; the heat conducting sheet is disposed in the gap, one side of the heat conducting sheet contacts the photosensitive chip, the other side of the heat conducting sheet contacts the circuit board, the heat dissipation plate disposed on a side of the circuit board away from the photosensitive chip, thereby causing heat generated by the photosensitive chip to conduct successively to heat conducting sheet, the circuit board, and the heat dissipation plate.

10. The electronic device according to claim 9, wherein a plurality of first conductive pads is disposed on the first surface, a plurality of second conductive pads is disposed on the circuit board, a conductive adhesive is disposed between the plurality of first conductive pads and the plurality of second conductive pads, and the circuit board and the base are electrically connected to each other through the plurality of second conductive pads and the plurality of first conductive pads.

11. The electronic device according to claim 10, wherein a plurality of third conductive pads is disposed on the third surface, the photosensitive chip comprises a plurality of solder balls corresponding to the plurality of third conductive pads, and the plurality of solder balls is electrically connected to the plurality of third conductive pads, so that the photosensitive chip is electrically connected to the base.

12. The electronic device according to claim 11, wherein the base further comprises a conductive line, the conductive line comprises the plurality of first conductive pads and the plurality of third conductive pads, and further comprises a line body embedded in the base.

13. The electronic device according to claim 9, wherein the heat dissipation plate is a steel plate.

14. The electronic device according to claim 9, further comprising a lens assembly and a filter, wherein the lens assembly is arranged on the filter, the filter is arranged on the second surface; the base further comprises a light through hole penetrating through the first surface and the third surface, the filter covers the light through hole, and a center axis of the light through hole is located on an extension line of a light through axis of the lens assembly.

15. The electronic device according to claim 9, wherein the heat conducting sheet is made of a heat conducting silica gel.

16. The electronic device according to claim 9, wherein the circuit board is a flexible circuit board.

\* \* \* \* \*